United States Patent
Craven et al.

(10) Patent No.: US 11,996,816 B2
(45) Date of Patent: May 28, 2024

(54) NON LINEAR FILTER WITH GROUP DELAY AT PRE-RESPONSE FREQUENCY FOR HIGH RES RADIO

(71) Applicants: Peter Graham Craven, Surrey (GB); John Robert Stuart, Cambridge (GB)

(72) Inventors: Peter Graham Craven, Surrey (GB); John Robert Stuart, Cambridge (GB)

(73) Assignee: LENBROOK INDUSTRIES LIMITED, Pickering (CA)

( * ) Notice: Subject to any disclaimer, the term of this patent is extended or adjusted under 35 U.S.C. 154(b) by 814 days.

(21) Appl. No.: 17/006,036

(22) Filed: Aug. 28, 2020

(65) Prior Publication Data

US 2020/0395918 A1     Dec. 17, 2020

Related U.S. Application Data

(63) Continuation of application No. 15/532,752, filed as application No. PCT/EP2015/078513 on Dec. 3, 2015, now Pat. No. 10,763,828.

(30) Foreign Application Priority Data

Dec. 3, 2014 (EP) .................................... 14196063
Dec. 3, 2014 (GB) .................................... 1421466

(51) Int. Cl.
*H03H 17/02* (2006.01)
*G11B 20/10* (2006.01)
(Continued)

(52) U.S. Cl.
CPC ......... *H03H 17/0261* (2013.01); *G11B 20/10* (2013.01); *H03H 17/04* (2013.01);
(Continued)

(58) Field of Classification Search
CPC .......... G11B 20/10; G11B 2020/10546; G11B 20/00; H03H 17/0261; H03H 17/04;
(Continued)

(56) References Cited

U.S. PATENT DOCUMENTS 5,388,221 A   2/1995   Meitner et al.
5,808,574 A   9/1998   Johnson et al.
(Continued)

FOREIGN PATENT DOCUMENTS

JP   63224513 A     9/1988
JP   2008252338 A   10/2008
(Continued)

OTHER PUBLICATIONS

Extended European Search Report for Application No. 14196063.3 dated May 13, 2015, 6 pp.
(Continued)

*Primary Examiner* — Yogeshkumar Patel
(74) *Attorney, Agent, or Firm* — Buckley, Maschoff & Talwalkar LLC

(57) ABSTRACT

Methods and devices are described for reducing the audible effect of pre-responses in an audio signal. The pre-responses are effectively delayed by employing a digital non-minimum-phase filter, which includes a zero lying outside the unit circle in its z-transform response. This zero is not paired with another zero at a reciprocal position inside the unit circle, as this would linearise the phase modification. The filtering can introduce a greater group delay at the pre-response frequency than at a low frequency, such as 500 Hz or even 0 Hz. The technique can be used to reduce pre-responses in an existing audio signal and also to pre-empt pre-responses that would be introduced to the audio signal by subsequent processing.

30 Claims, 11 Drawing Sheets

(51) Int. Cl.
*H03H 17/00* (2006.01)
*H03H 17/04* (2006.01)
*H03H 17/06* (2006.01)

(52) U.S. Cl.
CPC . *G10H 2250/071* (2013.01); *G10H 2250/121* (2013.01); *G11B 2020/10546* (2013.01); *H03H 2017/009* (2013.01); *H03H 2017/0472* (2013.01); *H03H 17/0664* (2013.01)

(58) Field of Classification Search
CPC ......... H03H 17/0664; H03H 2017/009; H03H 17/02; H03H 21/0012; H03H 2017/0472; G10H 2250/071; G10H 2250/121
USPC .......................................................... 700/94
See application file for complete search history.

(56) References Cited

U.S. PATENT DOCUMENTS

| | | | | |
|---|---|---|---|---|
| 6,522,265 | B1 * | 2/2003 | Hillman | G01S 1/047 340/988 |
| 6,760,451 | B1 * | 7/2004 | Craven | H03G 5/005 381/59 |
| 6,788,752 | B1 * | 9/2004 | Andre | H04L 27/2647 375/348 |
| 2009/0027117 | A1 | 1/2009 | Andersen et al. | |

FOREIGN PATENT DOCUMENTS

| | | | |
|---|---|---|---|
| WO | 92/10876 | A1 | 6/1992 |
| WO | 2013180945 | A2 | 12/2013 |
| WO | 2014108677 | A1 | 7/2014 |
| WO | WO-2014108677 | A1 * | 7/2014 ....... G11B 20/10046 |

OTHER PUBLICATIONS

Written Opinion of the International Searching Authority for Application No. PCT/EP2015/078513, Mar. 2, 2016, 6 pp.
International Search Report for PCT/EP2015/078513 dated Mar. 2, 2016, 5 pp.

* cited by examiner

NON LINEAR FILTER WITH GROUP DELAY AT PRE-RESPONSE FREQUENCY FOR HIGH RES RADIO

FIELD OF THE INVENTION

The invention relates to the processing of audio signals prior to commercial distribution for improved sound quality as heard by the consumer, and particularly to reducing the audible effect of pre-responses.

BACKGROUND TO THE INVENTION

Until approximately 1995, the 44.1 kHz sampling rate of the Compact Disc (CD) was regarded by most people as entirely adequate. Since 1995, the 'hi-res' movement has adopted sampling frequencies of 96 kHz, 192 kHz or higher, potentially allowing audio bandwidths of 40 kHz, 80 kHz or more. It has always been something of a puzzle as to why there should be any audible advantage in the bandwidth extension, since the CD's sampling rate of 44.1 kHz allows near-perfect reproduction of audio frequencies up to 20 kHz, the generally-accepted upper frequency limit of human hearing.

Superior time-resolution has been advanced as a possible explanation of the apparent paradox, and a recent paper by J. R. Stuart and P. G. Craven "A Hierarchical Approach to Archiving and Distribution" presented at the Audio Engineering Society Convention, Los Angeles, 11 Oct. 2014 [AES preprint no. 9178], explains this concept and cites several Neuroscience references that support this view.

According to this view, the impulse response of a recording and reproduction chain should be as compact in time as possible. Experience indicates that audible pre-responses are particularly undesirable and the above-cited reference presents an argument as to why this might be the case.

The many existing recordings stored at 44.1 kHz have generally either been made using an oversampling analogue-to-digital converter providing a 44.1 kHz output, or they have been explicitly downsampled from a recording made at a higher sampling rate. Filtering is required in both cases and until recently it was generally considered better to use linear phase filtering. Unfortunately, linear phase filtering always introduces pre-responses.

In the case of recordings made at sample rates such as 88.2 kHz or higher, the pre-response can be reduced by "Apodising" as described in Craven, P. G., "Antialias Filters and System Transient Response at High Sample Rates" J. Audio Eng. Soc. Volume 52 Issue 3 pp. 216-242; March 2004.

Typically an 88.2 kHz sampled system will have an antialias filter that cuts steeply at 40 kHz or some slightly higher frequency. The solution proposed in the paper is to 'apodise', that is to filter more gently starting at 20 kHz or a slightly higher and tapering down to zero by about 40 kHz. The sharp band-edge above 40 kHz is thereby rendered innocuous, since the apodising filter has removed the signal energy at frequencies that would provoke ringing or pre-responses. There remains some pre- and/or post-response from the apodising filter itself, but this can be much shorter in time since its transition band, from 20 kHz to 40 kHz, is much wider.

The situation is much less favourable for 44.1 kHz recordings. For these recordings it has generally been considered ideal to use a downsampling or antialias filter with a response flat to 20 kHz and then cutting sharply to be essentially zero by the Nyquist frequency of 22.05 kHz. It is thus not possible for an apodising filter to taper the response gently to zero by the frequency of the sharp-cut filter unless the apodising filter starts to taper at a lower frequency such as 15 kHz, which is not generally considered acceptable. Sometimes it is possible to improve the sound by a filter that begins to roll off at 20 kHz but in general there is a danger that an apodiser constrained thus will simply replace one band-edge by another nearly as sharp and at a slightly lower frequency.

What is needed therefore is an improved or alternative technique to minimise the undesirable audible effects of pre-responses, especially for signals that have been stored or will be transmitted at a relatively low sampling rate such as 44.1 kHz.

SUMMARY OF THE INVENTION

The inventors have realised that the audibility of a pre-response can be reduced not by directly attempting to reduce the amplitude of the pre-response but rather by using a non-minimum-phase zero to introduce group delay at frequencies where the pre-response has most energy.

Thus, according to a first aspect of the present invention, there is provided a method of reducing the audible effect of a pre-response having energy at a pre-response frequency, the method comprising introducing group delay at the pre-response frequency by filtering a digital audio signal using a digital non-minimum-phase filter having a z-transform response that includes a zero lying outside the unit circle.

Such a zero can used to create a greater group delay at the pre-response frequency than at low frequencies generally, including frequencies at or near 0 Hz. The zero should not be paired with another zero at a reciprocal position inside the unit circle, as happens in conventional linear phase filtering, as such pairing would linearise the phase modification provided by the zero and render it ineffective as a means of providing extra delay in the vicinity of the pre-response frequency.

A zero outside the unit circle introduces a 'maximum phase' element into the filter's transfer function, the resulting group delay thereby delaying the pre-response so that its time advance to the main peak of the impulse response is reduced and the pre-response is thereby less audible. With several such zeroes acting co-operatively, the time-advance may be reduced to zero or may be made negative; thus the pre-response may be transformed into a post-response, which is much less audible.

Signals retrieved from an archive may contain a pre-response already, in which case the invention will delay the existing pre-response. Alternatively, or in addition, the invention may be used pre-emptively to delay signal frequency components that could provoke the generation of a pre-response in a subsequent processing operation. In that case filtering according to the invention will pre-emptively delay the signal frequency components that would provoke the pre-response, delaying also the pre-response relative to lower-frequency components of the signal. The two situations are mathematically identical since linear filtering is a commutative operation.

Typically, pre-responses are caused by filtering operations performed in connection with a change of sample rate, it being usual to apply a steep-cut filter at a frequency just below a 'reference' Nyquist frequency corresponding to a 'reference' sample rate, being the lower of the sample rates involved. A pre-response thereby generated can be expected to have energy that lies predominantly within 20% of the said reference Nyquist frequency.

The method may be performed using a filter having many z-plane zeroes but the inventors have found that often a significant audible advantage may be obtained using a filter having as few as three zeroes outside the unit circle, each having the group delay properties referred to above. Specifically, if 'z' represents a time advance of one sample at a sampling frequency equal to twice the reference Nyquist frequency, it is preferred that the filter comprise at least three z-plane zeroes having reciprocals whose real parts are each more negative than $-0.5$.

In some embodiments, the method of the invention will be applied to a signal that has been downsampled from a higher frequency. In that case an appropriate reference sample rate is normally the sampling frequency of the digital audio signal.

Sometimes it is convenient to apply the method to a signal that has already been upsampled by a factor of two, or alternatively to a signal that will subsequently be downsampled by a factor of two. In that case, the reference sample rate is normally one half of the sampling frequency of the digital audio signal.

Increasingly, content is mastered for delivery at a '2×' sampling rate such as 96 kHz but often such content is mixed from heterogeneous sources, some of which have been recorded or processed at a '1×' reference sample rate such as 44.1 kHz or 48 kHz. These components of the audio mix may contain pre-responses with energy at or just below a corresponding reference Nyquist frequency of 22.05 kHz or 24 kHz. A 96 kHz sampled signal could therefore have such pre-responses along with further pre-responses having energy just below a signal Nyquist frequency of 48 kHz. In such cases it may be advantageous so treat both groups of pre-responses according to the invention using further zeroes appropriately positioned outside the unit circle. Of course, if the '1×' reference sample rate is not clearly distinguished from the signal sample rate then this double processing is less relevant and it seems wise to concentrate on situations in which the '1×' pre-responses have a frequency not exceeding 60% of the signal Nyquist frequency.

A z-plane zero close to a Nyquist frequency will create an amplitude response that is severely depressed in the vicinity of the Nyquist frequency. The amplitude response may be flattened completely by incorporating also a pole at a reciprocal position in the z-plane, the zero and the pole in combination forming an all-pass factor in the filter's transfer function.

Alternatively, the amplitude response may be flattened at lower frequencies by adding poles having frequencies slightly lower than the zeroes, the poles being configured to provide an amplitude response flat within a tolerance such as 1 dB over a frequency range important to the ear, such as 0 to 16 kHz.

The delay produced by the filtering method of the first aspect can be characterised by comparison with a 'reference delay' which could be the delay at a lower comparison frequency such as 500 Hz or 0 Hz or alternatively it could be the delay time to the largest peak in the filter's impulse response. Normally the delay at the pre-response frequency will exceed the reference delay by a finite margin, for example by ten cycles at the pre-response frequency. For a pre-response near 20 kHz this would be a margin of 0.5 ms.

According to a second aspect of the present invention there is provided a mastering processor adapted to receive a first digital audio signal and to furnish a second digital audio signal for distribution, wherein the mastering processor is configured to perform the method of the first aspect of the invention to reduce the audible effect of a pre-response in a signal rendered from the second signal for auditioning by a listener.

Thus, the method of the first aspect is performed by a mastering processor that receives audio 'tracks' from an archive and adjusts them prior to commercial release. Often, tracks within the archive will have pre-responses, which the method delays in order to reduce their audible effect. The mastering processor may also pre-emptively delay pre-responses produced by upsampling or downsampling in listeners' equipment.

According to a third aspect of the present invention there is provided a consumer equipment having an input adapted to receive a digital audio signal, the consumer equipment configured to process the received digital audio signal according to the method of the first aspect of the invention.

In this way, equipment designed for home listening may perform the method of the first aspect to improve the sound quality from existing CDs and other sources that have not been mastered according to the invention. The equipment may also perform the method in order to precondition a digital audio signal prior to a digital-to-analogue conversion that may generate pre-responses.

It is noted that the invention may be embodied in hardware, such as custom logic built into an ADC or DAC, or in software, or in a combination of both.

According to a fourth aspect of the present invention there is provided a recorded medium conveying a digital audio signal processed by the method of the first aspect. Such a recording will have minimal inherent pre-responses and/or will delay the generation of pre-responses that would otherwise be audible on reproduction.

According to a fifth aspect of the present invention there is provided a computer program product comprising instructions that when executed by a signal processor causes said signal processor to perform the method of the first aspect.

Such a program product may implement a digital signal processor (DSP) that performs the mastering behaviour of the invention. Alternatively, the program product may implement an upgrade to an existing DSP, which allows it to perform the mastering behaviour of the invention. A similar upgrade may be provided to the processing capability of end-user consumer equipment. Indeed, the invention may be implemented in software "apps" for mobile phones and the like, or in upgrades therefor. The ability to "retrofit" such an upgrade to existing equipment in order that it can implement the invention is a particularly advantageous feature.

As will be appreciated by those skilled in the art, the present invention provides methods and devices for reducing the audible effects of pre-responses in an audio signal, and which can do so in the context of reducing the audible effects of existing pre-responses in an audio signal and/or by taking pre-emptive action in anticipation of pre-responses that would be introduced by subsequent processing. The pre-responses are effectively delayed by employing a digital non-minimum-phase filter, which includes a zero lying outside the unit circle in its z-transform response. Further variations and embellishments will become apparent to the skilled person in light of this disclosure.

BRIEF DESCRIPTION OF THE DRAWINGS

Examples of the present invention will be described in detail with reference to the accompanying drawings, in which.

DETAILED DESCRIPTION

Figure 1:
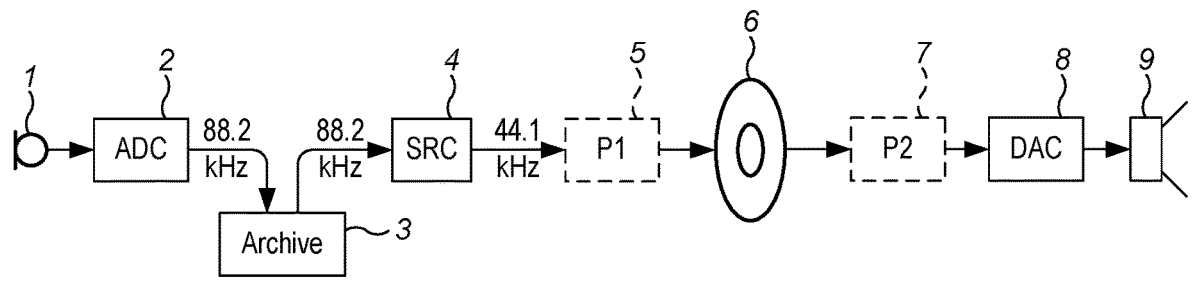
FIG. 1 illustrates schematically a complete recording and reproduction chain.

FIG. 1 shows an example recording and reproduction chain in which a sound is captured by a microphone 1, converted to digital form by an analogue-to-digital-converter (ADC) 2 and the resulting signal stored in an archive 3. At some later time the signal is retrieved from the archive and may pass through a sample rate converter (SRC) 4 and further processing (P1) 5 before being distributed 6 to listeners either via a physical medium such as Compact Disc (CD) or by an intangible medium such as radio broadcasting or Internet transmission.

The listener's equipment 7, 8, 9 includes a digital to analogue converter (DAC) 8 and a transducer 9 such as a headphone or loudspeaker, and optionally further processing (P2) 7.

As will be described later, processing according to the invention may be provided either as P1 in the mastering equipment 5 or as P2 in the listener's receiving equipment 7. In both cases, pre-rings generated by the ADC2 or the SRC 4 or by the listener's DAC 8 will be treated. In some implementations, processing according to the invention may be provided at both locations. Furthermore, in some embodiments, processing according to the invention may be provided before the SRC, if present, or even before the Archive.

The CD uses a sample rate of 44.1 kHz and throughout the 1980s and 1990s many companies operated the whole recording chain at 44.1 kHz, also archiving at 44.1 kHz so that the SRC 4 was not used. More recently there has been a tendency to run the ADC and the archive at a higher rate such as 44.1 kHz, 88.2 kHz, 176.4 kHz, 192 kHz, or even 2.8224 MHz for 1-bit 'DSD' recording, thus necessitating the sample rate converter 4, which can be either a separate piece of hardware or part of a software Digital Audio Workstation (DAW).

Sample rate conversion has a strong potential to generate pre-responses because of the necessary filtering. This problem is not evaded by running the whole chain at 44.1 kHz, for most commercial ADCs that furnish a 44.1 kHz output will operate internally at a higher frequency and then use a sample rate conversion process to provide the desired output sample rate.

Diverse architectures are known for sample rate conversion, the choice depending on factors such as whether the frequencies involved are in a simple integer ratio such as 2:1 or a more 'difficult' ratio such as 48:44.1. Alias-free downsampling to 44.1 kHz however always requires a low-pass filter that cuts quite sharply above 20 kHz. The requirements on the shape of the filter are not critically dependent on the sampling frequency of the source signal. This is true also for upsampling to an arbitrary new sample rate. Thus both downsampling and upsampling/reconstruction generate a requirement for a digital low-pass filter known as an 'antialias' filter when downsampling or as a 'reconstruction' filter when upsampling. The technical requirements for the two filters are not necessarily very different.

Opinion is divided on whether, when downsampling audio to 44.1 kHz or upsampling from 44.1 kHz, the low-pass filter should provide a substantial 'stop-band' attenuation such as 90 dB at 22.05 kHz or whether it acceptable to use a filter such as a 'half-band' operating at 88.2 kHz and configured to provide 6 dB attenuation at 22.05 kHz and full attenuation by 24.1 kHz. Historically, it was usual to make the filter's transition band as wide as was considered acceptable in order to minimise the number of taps in a hardware transversal ('FIR') implementation. The transition band was thus about 2 kHz wide, for example from 20 kHz to 22.05 kHz, or alternatively about 4 kHz wide, for example from 20 kHz to 24.1 kHz. More recent software implementations have provided much narrower transition bands, for example the recent 'Adobe Audition CS 5.5' DAW offers SRC facilities having a transition band about 100 Hz wide, starting about 75 Hz below the Nyquist frequency.

Figure 2:
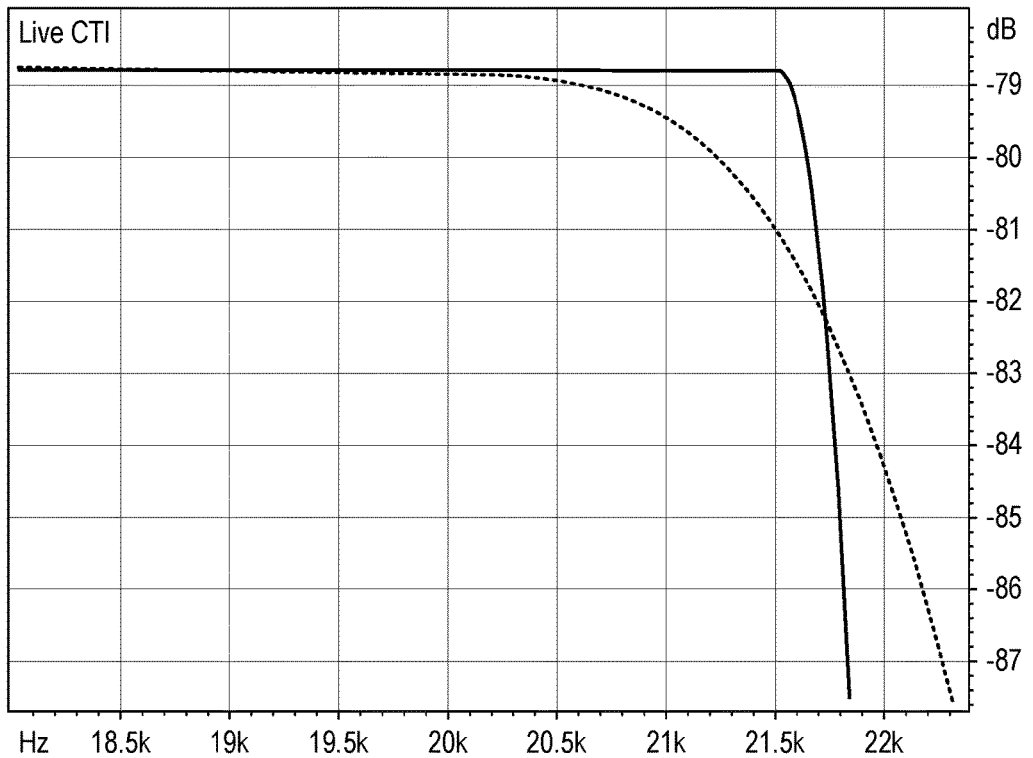
FIG. 2 shows (solid line) the transition band of the filter used by Adobe 'Audition 1.5' when downsampling from 88.2 kHz to 44.1 kHz, and (dashed line) the transition band of an Arcam FMJ DV139 player when playing a CD.

Perhaps more typical is the earlier 'Adobe Audition 1.5' DAW which offers a filter having a transition band about 500 Hz wide, starting at 21.5 kHz. Many commercially issued recordings exhibit a near-Nyquist noise spectrum that suggests that a filter such as this may have been used at some stage in the processing. FIG. 2 shows the Adobe filter's transition band and also the transition band of the analogue output of a well-regarded 'universal' disc player from Arcam when playing a 44.1 kHz CD. The Arcam response is about 6 dB down at the Nyquist frequency, suggesting that an initial 1:2 upsampling may have been performed using a 'half-band' filter. Other plots of transition bands are shown in the "Sample Rate Conversion Comparison Project", currently accessible at http://infinitewave.ca/resources.htm.

Figure 3A:
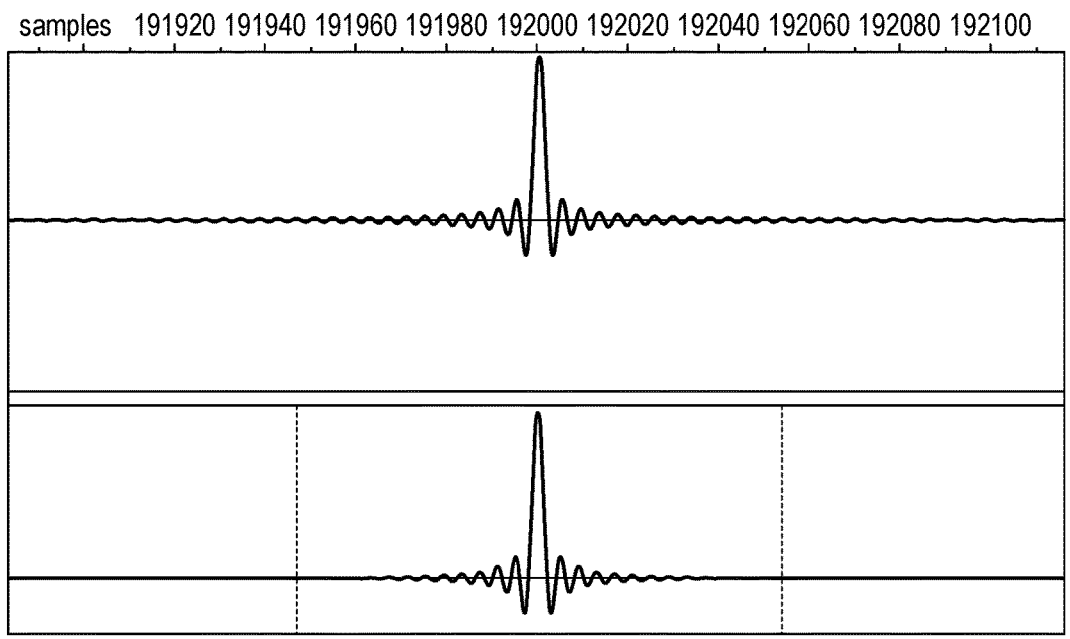
FIG. 3A shows (upper trace) an impulse response of the Adobe downsampling filter of FIG. 2, the time-axis referring to sample periods at an 88.2 kHz sampling rate, and (lower trace) an impulse response of the Arcam reconstruction filter of FIG. 2.

The impulse responses of the Adobe and Arcam filters are shown in FIG. 3A, each having a pre-ring and a post-ring approximately at the Nyquist frequency. The Adobe filter has the longer pre- and post-responses as might be expected from its narrower transition band. Close examination reveals that the Arcam response is essentially zero outside the region bounded by the two vertical lines, suggesting that a first upsampling from 44.1 kHz to 88.2 kHz has been performed using an FIR filter with a span of about 107 sample periods at 88.2 kHz.

Figure 3B:
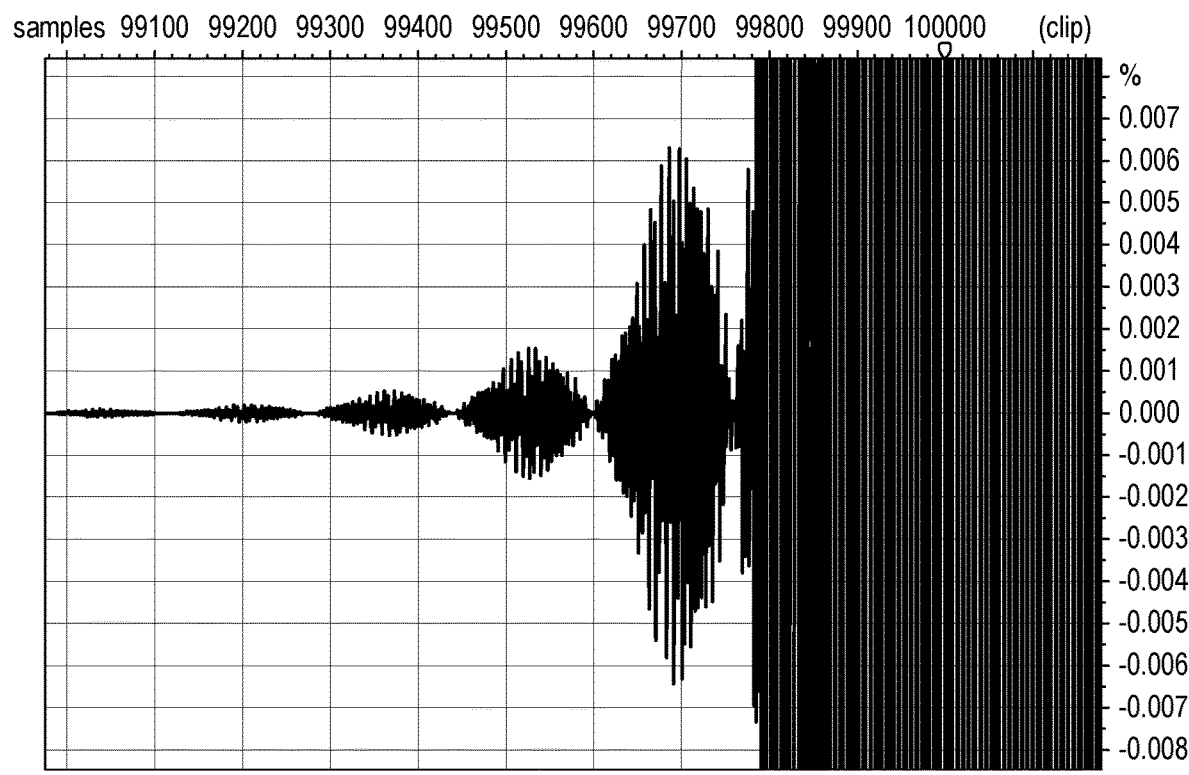
FIG. 3B shows more detail of the Adobe pre-responses of FIG. 3A.
Figure 3C:
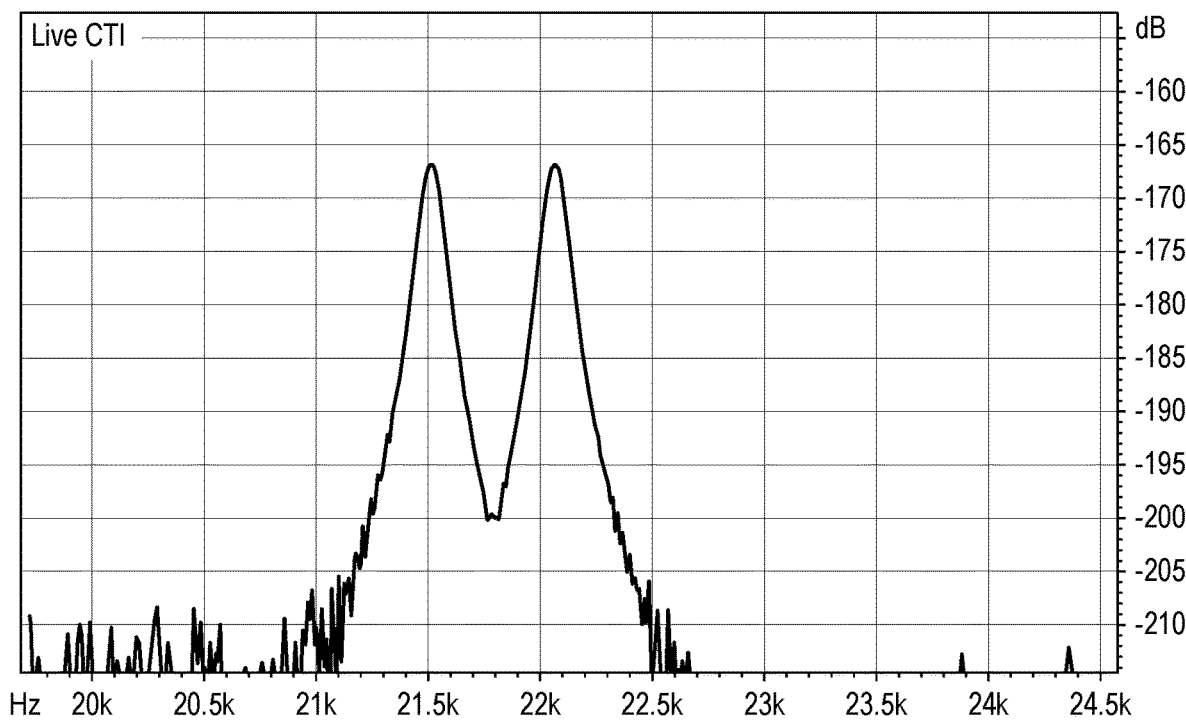
FIG. 3C shows a spectrum of part of the Adobe pre-response of FIG. 3A

The Adobe plot is in fact the output of 'Adobe Audition 1.5' when upsampling a single impulse in a 44.1 kHz stream to 88.2 kHz, with the "Pre/Post Filter" and "Quality=999" options selected. Investigation reveals that the same filter is used internally when Audition is used to downsample from 88.2 kHz to 44.1 kHz. In the far 'tail' of the pre-response, FIG. 3B, we see a 'beating' effect and on taking a windowed Fourier transform of the tail, FIG. 3C we see two distinct frequencies, 21.5 kHz and 22.05 kHz, corresponding approximately to the two edges of the transition band.

To remove the Audition filter's pre-ring a double-notch filter might therefore be indicated but this would be specific to the Audition 1.5 SRC. We desire a more general method since a music archive may contain 44.1 kHz recordings made and/or downsampled using diverse and possibly unknown equipment.

Pre-Response Suppression by Filtering

Figure 4A:
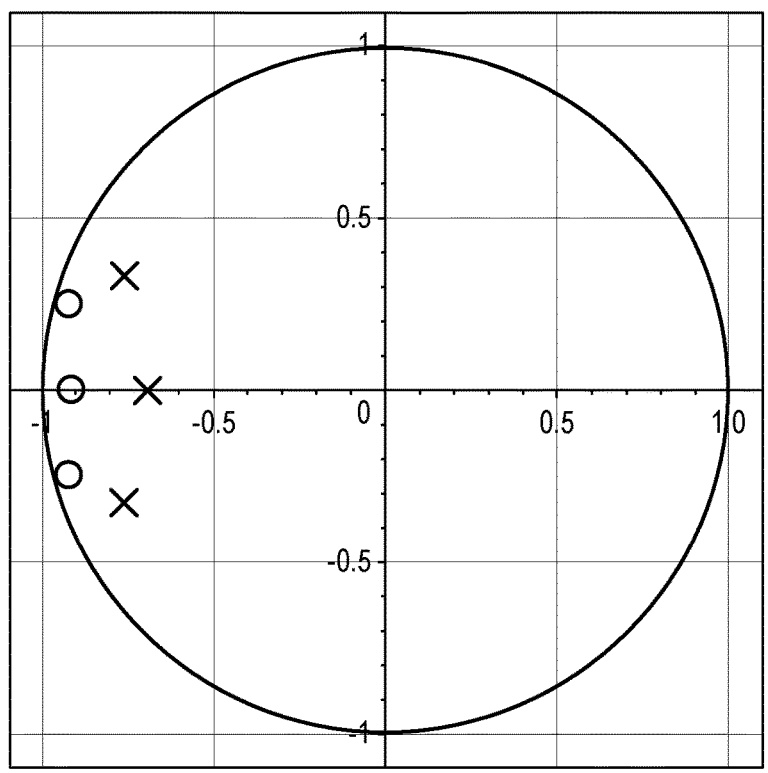
FIG. 4A shows the poles and zeroes of a 3rd order IIR low-pass filter.
Figure 4B:
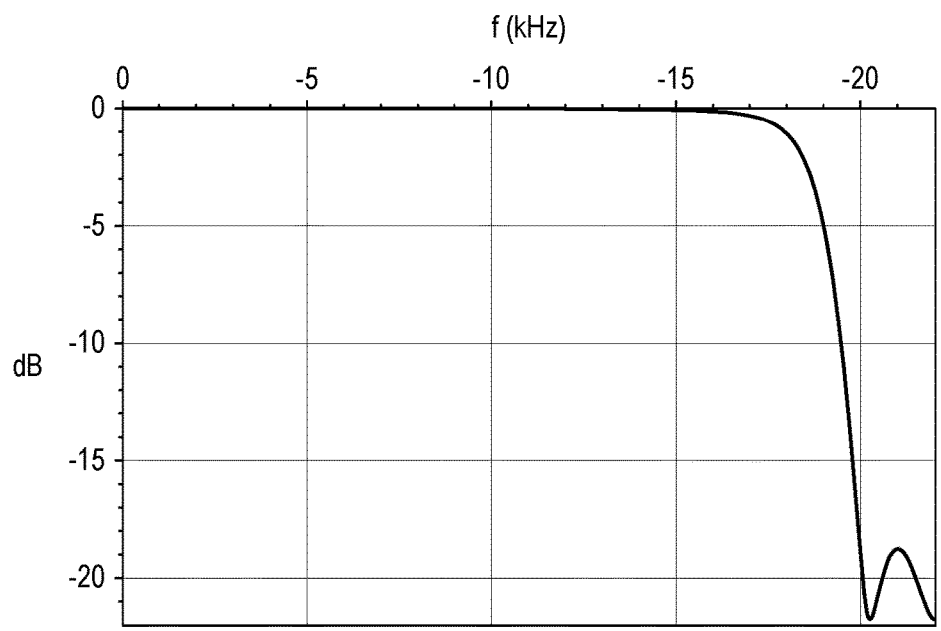
FIG. 4B shows the frequency response of the filter of FIG. 4A.
Figure 4C:
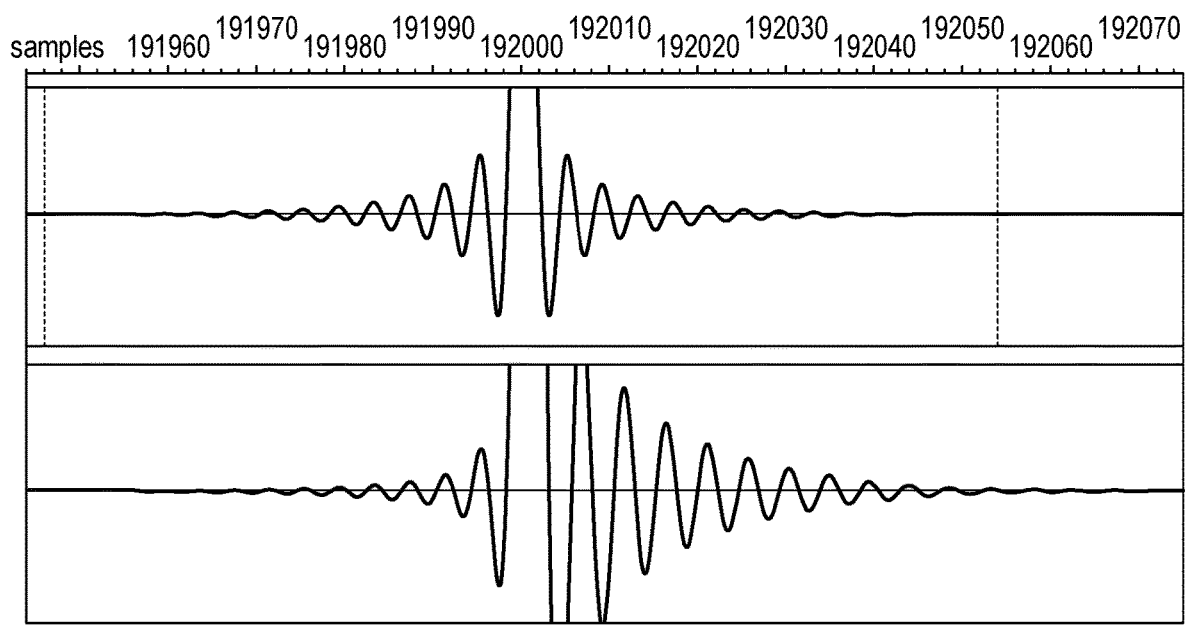
FIG. 4C shows (upper trace) Arcam impulse response, and (lower trace) Arcam impulse response with pre-processing by the 3rd order IIR low-pass filter of FIG. 4A, both plotted with a 5× expanded vertical scale.

Assuming pre-responses may have energy in the range 20 kHz-22.05 kHz, one approach is to attenuate this frequency range. A third order IIR filter having the following z-transform response:

$$\frac{(1.0443\ z + 0.9576)(1.0447\ z^2 + 1.9309\ z + 0.9572)}{(1.2039\ z + 0.8307)(1.2096\ z^2 + 1.8335\ z + 0.8267)}$$

attenuates the region 20 kHz-22.05 kHz by 20 dB when operated at a 44.1 kHz sample rate. This IIR filter has poles (crosses) and zeroes (circles) as shown in FIG. 4A and the frequency response shown in FIG. 4B. FIG. 4C shows the Arcam response to a single impulse and to an impulse pre-processed using the above filter. It will be seen that the processing has reduced the pre-response significantly, at the expense of a larger post-response and a frequency response droop of 1 dB at 18 kHz.

According to the invention, the pre-responses may be further reduced by replacing the minimum-phase filter shown above by the corresponding maximum-phase filter, as follows:

$$\frac{(1.0443 + 0.9576\ z)(1.0447 + 1.9309\ z + 0.9572\ z^2)}{(1.2039\ z + 0.8307)(1.2096\ z^2 + 1.8335\ z + 0.8267)}$$

Figure 5A:
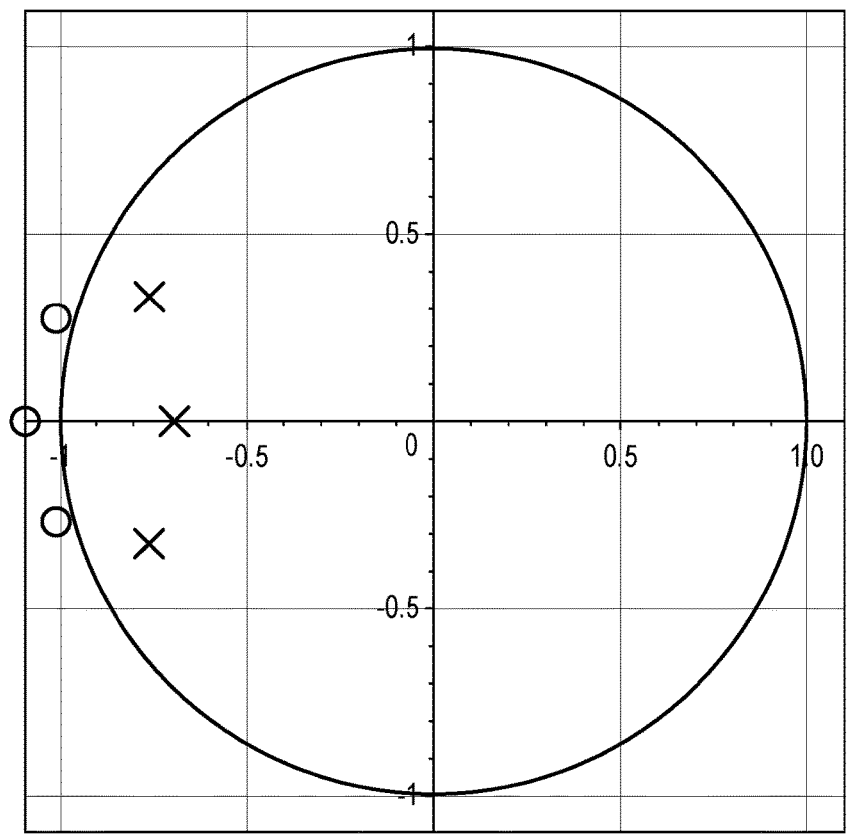
FIG. 5A shows the poles and zeroes of a maximum-phase 3rd order IIR low-pass filter having the same frequency response as FIG. 4B.
Figure 5B:
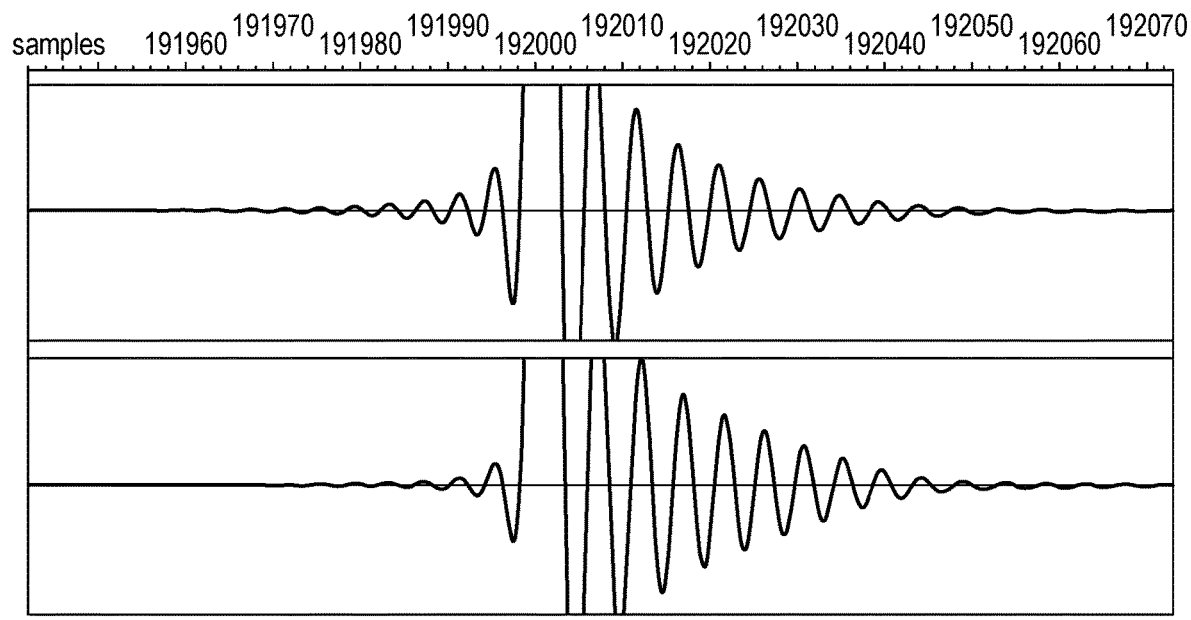
FIG. 5B shows Arcam impulse responses with pre-processing (upper trace) by the 3rd order IIR low-pass filter of FIG. 4A, and (lower trace) by the maximum-phase filter of FIG. 5A, both plotted with a 10× expanded vertical scale.

This filter has the same poles but with zeroes outside the unit circle, as shown in FIG. 5A. The frequency response is unchanged from the response shown in FIG. 4B. FIG. 5B compares the two responses on a 10× expanded vertical scale, showing that the maximum-phase filter reduces the downswing immediately prior to the main impulse by 4 dB relative to the minimum-phase filter and it reduces the other pre-responses by 6 dB or more.

Figure 6A:
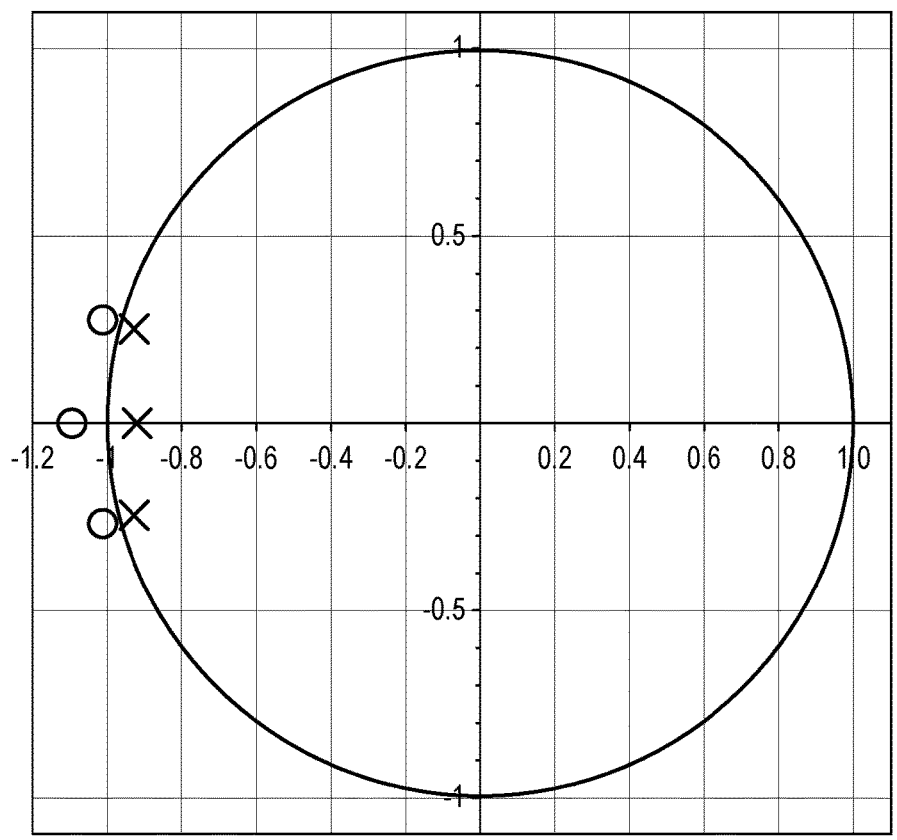
FIG. 6A shows the poles and zeroes of an all-pass filter having the same zeroes as the filter of FIG. 5A.
Figure 6B:
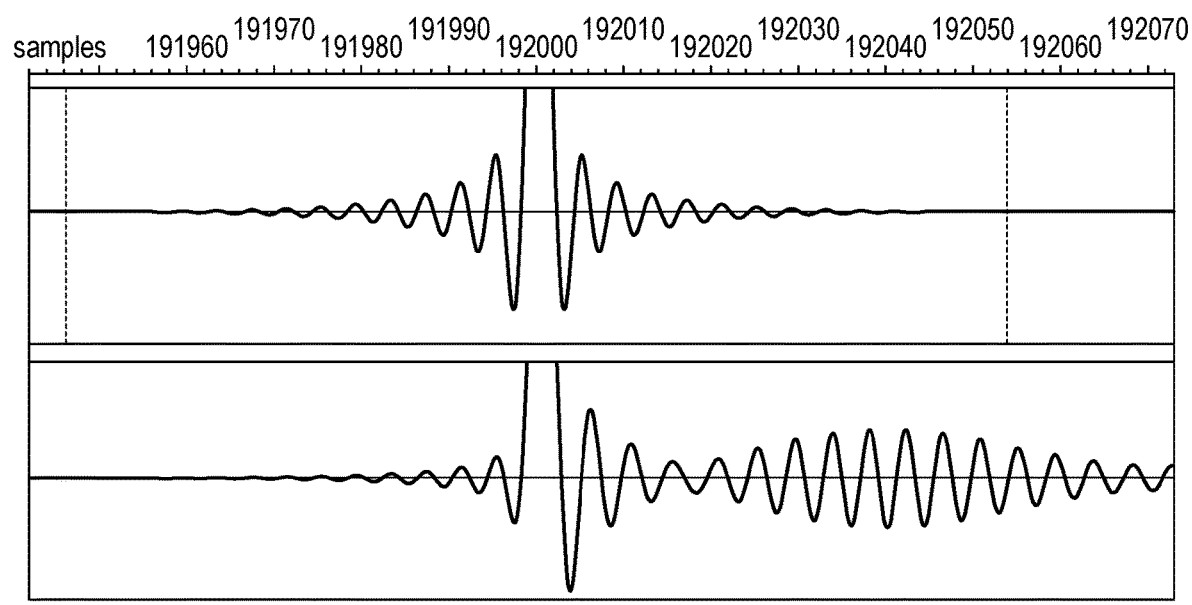
FIG. 6B shows a comparison between (upper trace) the 'Arcam' impulse response shown also in FIG. 3A; and (lower trace) the Arcam impulse response pre-processed by the all-pass filter of FIG. 6A, both plotted with a 5× expanded vertical scale.

With zeroes outside the unit circle, it is now possible to adjust the poles inside the unit circle so as to create an all-pass filter:

$$\frac{(1.0443 + 0.9576\ z)(1.0447 + 1.9309\ z + 0.9572\ z^2)}{(1.0443\ z + 0.9576)(1.0447\ z^2 + 1.9309\ z + 0.9572)}$$

whose poles and zeroes are shown in FIG. 6A. This filter has a flat frequency response from zero to the Nyquist frequency, a property that some authorities would consider highly desirable. FIG. 6B shows that this filter is able to reduce pre-responses significantly even though it provides no attenuation at pre-responses frequencies.

Figure 7A:
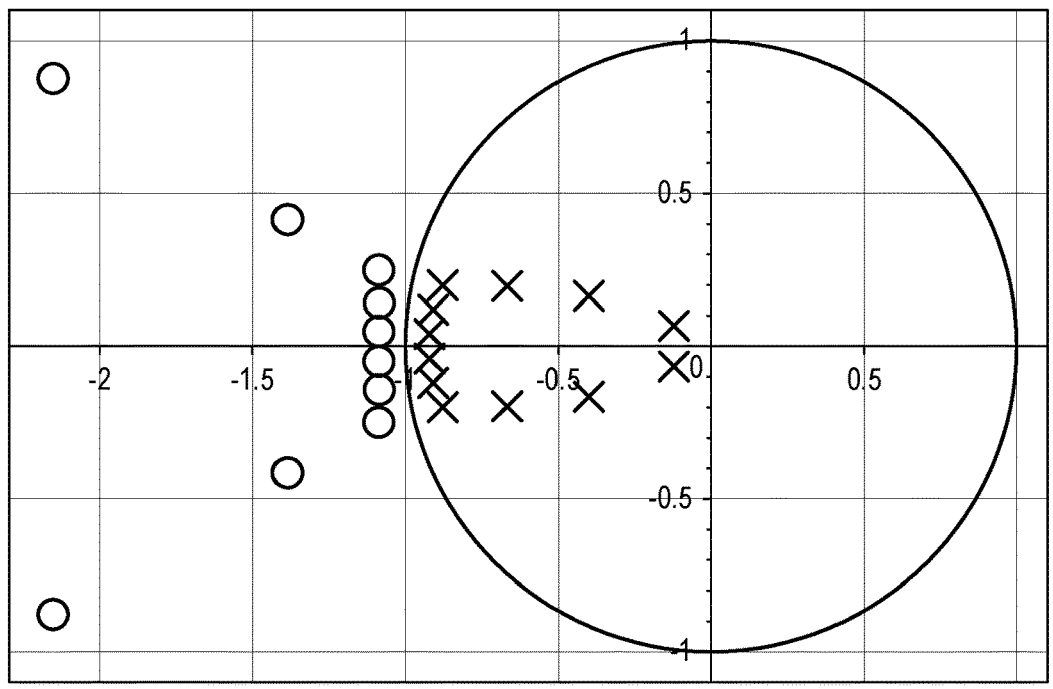
FIG. 7A shows the poles and most of the zeroes of a 12th-order all-pass filter, two of the zeroes being outside the range of the plot.

More powerful suppression of pre-responses is provided by a 12th order all-pass filter, as follows:

$$\left(\frac{1 + 1.84\ z + 0.85\ z^2}{z^2 + 1.84\ z + 0.85}\right)\left(\frac{1 + 1.81\ z + 0.84\ z^2}{z^2 + 1.81\ z + 0.84}\right)\left(\frac{1 + 1.75\ z + 0.81\ z^2}{z^2 + 1.75\ z + 0.81}\right)\times$$

$$\left(\frac{1 + 1.33\ z + 0.48\ z^2}{z^2 + 1.33\ z + 0.48}\right)\left(\frac{1 + 0.80\ z + 0.19\ z^2}{z^2 + 0.80\ z + 0.19}\right)\left(\frac{1 + 0.24\ z + 0.02\ z^2}{z^2 + 0.24\ z + 0.02}\right)$$

whose poles and zeroes are shown in FIG. 7A.

Figure 7B:
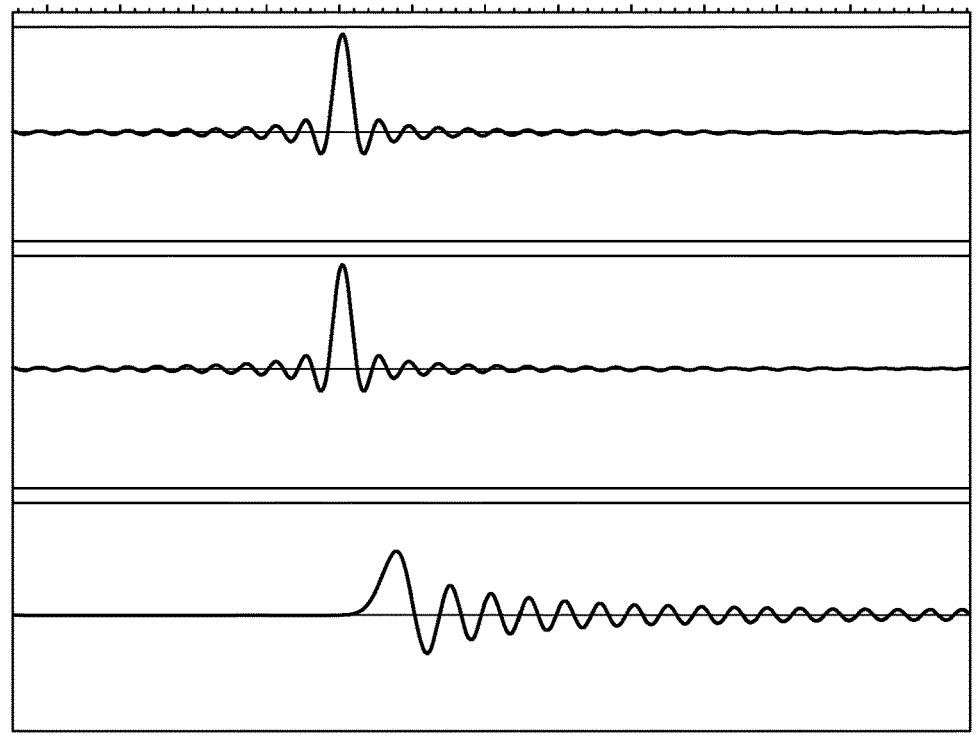
FIG. 7B shows (top trace) impulse response of Adobe 'Audition 1.5' downsampling filter, (middle trace) impulse response of Adobe 'Audition 1.5' downsampling filter followed by the Arcam reconstruction filter, and (bottom trace) impulse response of Adobe 'Audition 1.5' downsampling filter followed by the 12th-order all-pass filter of FIG. 7A followed by the Arcam reconstruction filter.

Referring to FIG. 7B, the top trace shows the impulse response of the 'Adobe Audition 1.5' filter alone while the middle trace folds in the response of the Arcam FMJ DV139 player in an attempt to model a signal chain such as that shown in FIG. 1. The rings far from the central peak are attributable to the sharp transition band of the Audition filter and folding in the Arcam response reduces them slightly because of its ~6 dB attenuation at the Nyquist frequency, although the reduction is too small to be visible in FIG. 7B.

The bottom trace of FIG. 7B includes the effect of processing the 44.1 kHz signal with the 12th order all-pass filter above. The pre-responses have been almost completely removed. This processing has been found to provide a substantial audible improvement on many commercially-issued recordings.

Figure 8:
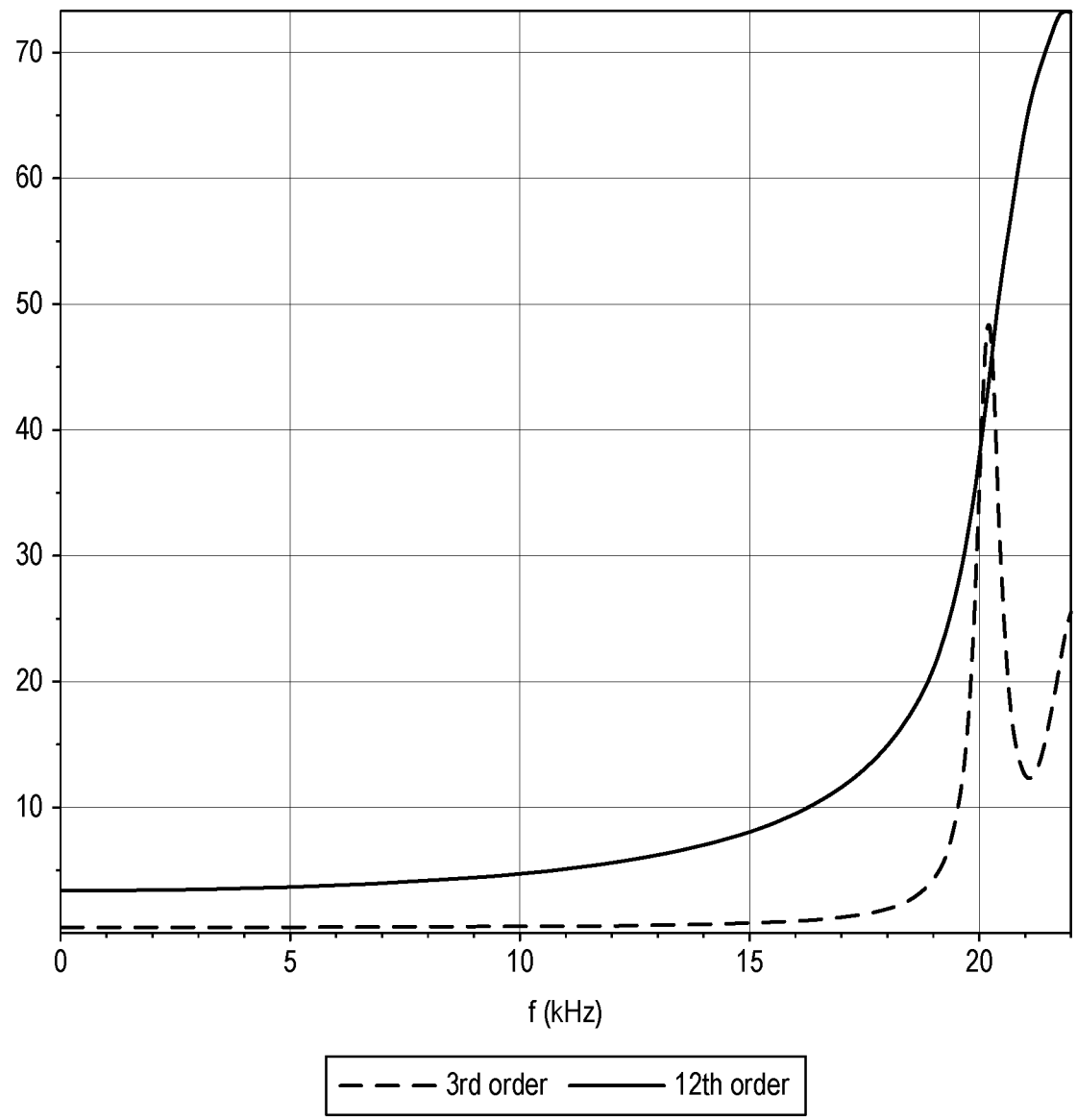
FIG. 8 shows group delays of (solid line) the 12th order all-pass filter of FIG. 7A and (dashed line) the 3rd order all-pass filter of FIG. 6A. The vertical axis is calibrated in sample periods at the 88.2 kHz sampling rate.

FIG. 8 shows the group delays of the all-pass filters of FIG. 6A (3rd order) and FIG. 7A (12th order). Recalling from FIG. 3C that the spectral energy of the pre-responses lies mainly above 20 kHz, the plots of FIG. 8 strongly suggest that the action of these all-pass filters is to delay the pre-responses, thus converting them into post-responses.

Figure 9:
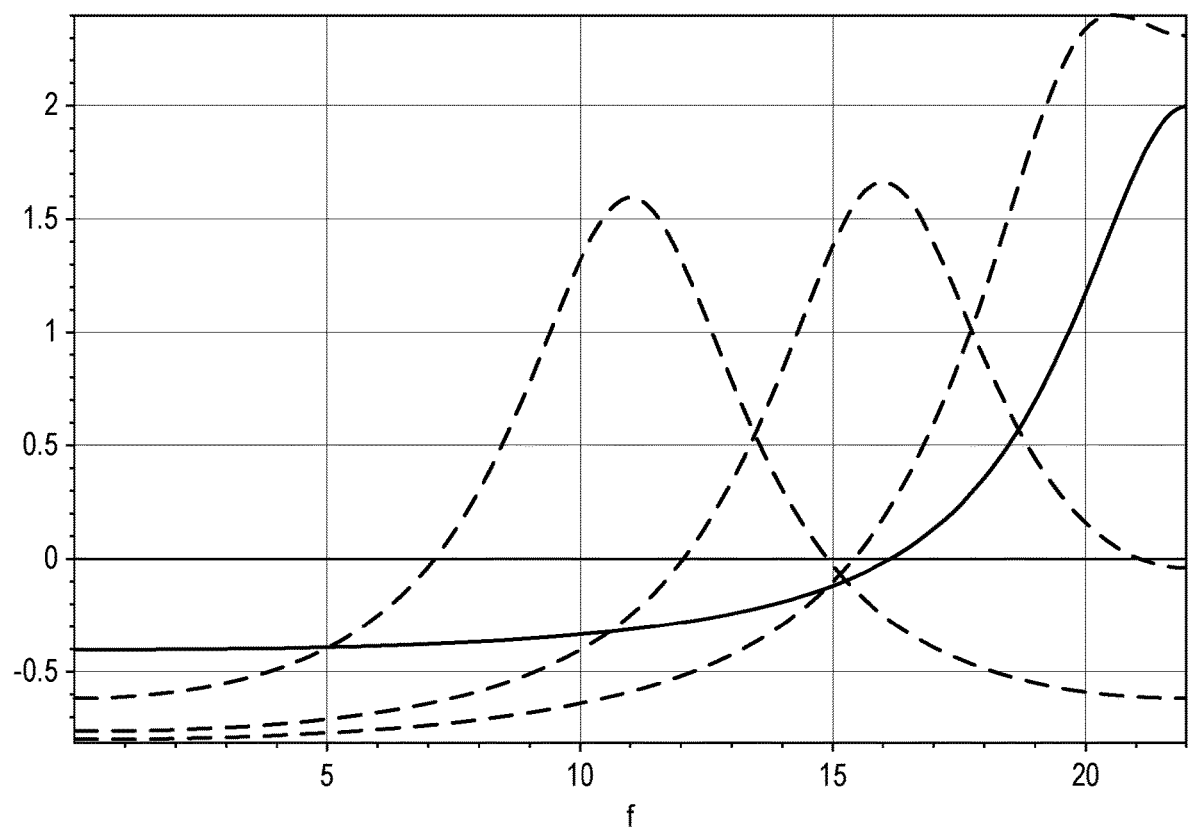
FIG. 9 shows group delays in sample periods of (full line) a single zero at z=−1.5, i.e. at radius 1.5 and frequency 22.05 kHz, and (dashed lines) conjugate pairs of zeros at radius 1.5 and frequencies of 20 kHz, 16 kHz and 11.025 kHz.

To measure pre-response delay a reference is needed, since a modest delay of the total signal does not affect the audio quality. One may conjecture that the ear may use as reference the highest peak in a filtered impulse response or a filtered envelope response. In practice it is found that non-minimum-phase zeroes each having a larger group delay in the vicinity of 20 kHz than at low audio frequencies are helpful. We note that group delay at a frequency of 0 Hz is well-defined mathematically: the group delay versus frequency of non-minimum-phase zeroes having various frequencies over the range 11.025 kHz-22.1 kHz are plotted in FIG. 9. It will be seen that the group delay near 0 Hz is negative.

Referring again to FIG. 7A, it can be conjectured that the two pole-pairs closest to the origin, namely at $-0.12\pm0.06$ i and $-0.4\pm0.16$ i (where $i=\sqrt{-1}$), together with their corresponding zero-pairs at the reciprocal positions:

$$1/(-0.12\pm0.06i)=-6.46\pm3.43i$$

and $$1/(-0.4\pm0.16i)=-2.15\pm0.87i$$

are contributing little to the group delay near 20 kHz relative to group delay at low audio frequencies. Calculation confirms that indeed these four zeroes and four poles can be deleted while affecting the said relative group delay by only 5% but saving 33% in filter complexity.

Thus in the case of all-pass filters, it is the poles whose real part is more negative than $-0.5$ together with their corresponding zeroes that are most helpful in delaying pre-responses close to the Nyquist frequency. In the case of filters that are not all-pass, it is the zeroes that are important since a zero can provide helpful attenuation even if there is no corresponding pole. Thus in general, it is the zeroes whose reciprocals lie inside the unit circle and whose real parts are more negative than $-0.5$ that are most helpful in reducing pre-responses.

In some cases it is possible to deduce the presence of a non-minimum-phase zero in a filtering apparatus by feeding in a sine-wave with an exponentially rising envelope. For example, in the case of the filter represented in FIG. 6A, a sine-wave at a frequency of 20.2 kHz with envelope increasing by a factor of 1.045 on each sample period would theoretically produce zero output because of the zero at $-1.0086+0.2723$ i.

Of course, such a test signal must have a restricted duration in order not to provoke overload and care must be taken that processing delay is not mistaken for attenuation. A suitable test signal might start at a very low amplitude and contain an impulse as a time reference at the end of the increasing sine-wave. The test could include a comparison of the response to that signal with the response to a sine-wave at the same frequency but with constant amplitude. However, it is not practical to test for zeroes that are far outside the unit circle in this way and there may also be signal-to-noise difficulties in the case of zeroes that are extremely close to other zeroes. In difficult cases one may alternatively capture the impulse response of the apparatus to high precision using a technique such as chirp excitation, and then apply a root-finding algorithm to the impulse response.

In the situation depicted in FIG. 1, processing according to the invention may be placed either as P1 in the mastering equipment 5 or as P2 in the listener's receiving equipment 7. In both cases, pre-rings generated by the SRC 4 or by the listener's DAC 8 will be treated. FIG. 7B provides a demonstration that pre-rings from both devices can be effectively suppressed in a single operation. When new recordings are released it would be obvious to place the treatment at P1 for the benefit of all listeners. Placement at P2 is however of value to listeners who may already have a collection of media 6 containing recordings that have not been treated.

The treatment has also been found useful for 'hi-res' recordings at a sample frequency such as 96 kHz which may contain pre-rings having frequencies closer to 48 kHz. The same filter architecture and coefficients have been used, but clocked at 96 kHz so that the large group delay is achieved at frequencies in the range 44 kHz to 48 kHz.

Separately from the above, it is sometimes required to treat a signal that has already been upsampled: for example there is evidence that some nominally 88.2 kHz or 96 kHz commercially available recordings have been upsampled from 44.1 kHz or 48 kHz respectively, thereby containing pre-responses just above 20 kHz. In these cases we must distinguish between the sampling frequency of the signal presented for treatment and a 'reference' sampling frequency which relates to the process that created, or will subsequently create, the pre-rings it is desired to treat. Similar care is needed over the 'z-transform': for implementation purposes 'z' must represent a time advance of one sample of the signal presented for processing, but the criterion previously discussed relating to the positions of zeroes assumes a 'z' that represents one sample period of the process that produced or will produce a pre-response.

Figure 10A:
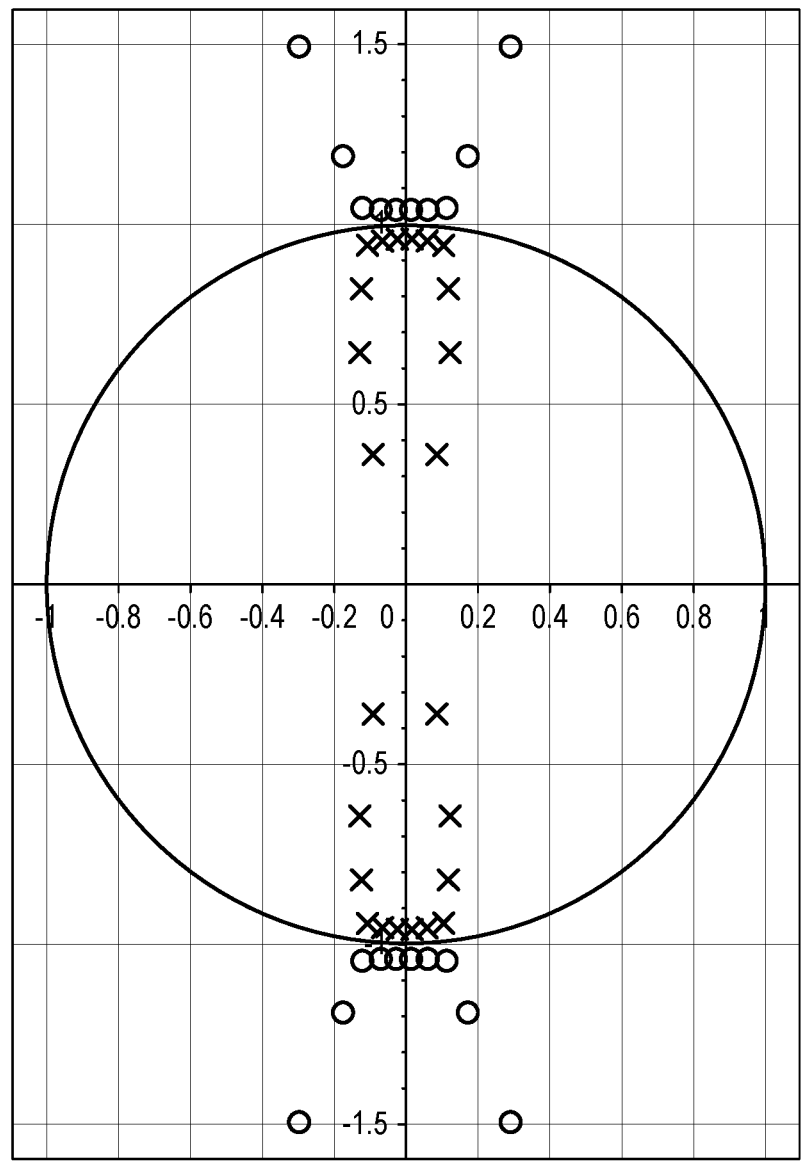
FIG. 10A shows the poles and most of the zeroes of the all-pass filter of FIG. 7A modified for operation at a higher sample rate. Two of the zeroes are outside the range of the plot; and, FIG. 10B shows the group delay (τ) in sample periods of the all-pass filter of FIG. 10A when operated at a sample rate of 88.2 kHz.
Figure 10B:
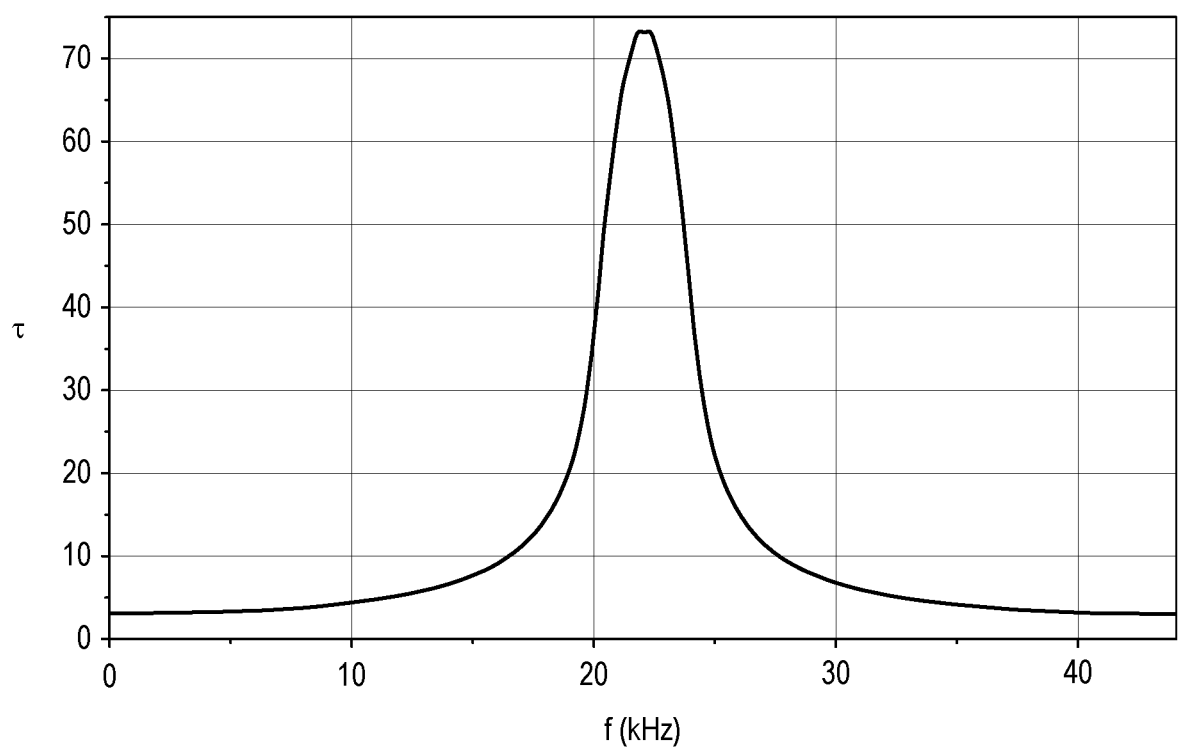

For the case where the reference sampling frequency is one-half of the signal's sampling frequency, an appropriate modification to the improvement filters already presented is to replace z by $z^2$ throughout, and hence $z^2$ is replaced by $z^4$. The poles and zeroes shown in FIG. 7A are thereby replaced by those shown in FIG. 10A, and if the signal's sampling rate is 88.2 kHz then the group delay shown as the solid trace in FIG. 8 is extended by reflection about 22.05 kHz as shown in FIG. 10B.

The filters thus modified could alternatively be implemented by separate processing of substreams consisting of odd samples and even samples respectively, and this may be more economical.

These possibilities are not exhaustive, and although the processing will be performed digitally, it is not excluded that analogue media may intervene. For example, the archive 3 in FIG. 1 may be a library of analogue tapes, some of which may contain pre-responses because digital effects units operating internally at 44.1 kHz have been used to process the signal. As long as analogue media can be assumed linear, processing at the mastering stage 5 will be just as effective in suppressing these pre-responses as in an all-digital system.

The invention claimed is:

1. A method for reducing the audible effect of a pre-response having energy at a pre-response frequency, the method comprising:
   receiving a digital audio signal;
   generating a modified digital audio signal by introducing group delay at the pre-response frequency by filtering the digital audio signal using a digital non-minimum-phase filter having a z-transform response that includes a zero lying outside the unit circle whose phase response is not linearised by a zero at a reciprocal position inside the unit circle; and
   providing the modified digital audio signal for further processing.

2. The method according to claim 1, further comprising:
   performing further processing on the modified digital audio signal; and
   providing the further processed modified digital audio signal for subsequent delivery to a device.

3. The method according to claim 2, wherein the device is one of (i) a distributor, (ii) an audio listening device, (iii) an audio mixer, and (iv) an archive.

4. A method according to claim 1, wherein the digital audio signal contains the pre-response prior to the filtering.

5. A method according to claim 1, wherein the filtering preconditions the digital audio signal to reduce a pre-response that will be generated in a subsequent resampling process.

6. A method according to claim 1, wherein the pre-response frequency lies within 20% of a reference Nyquist frequency equal to one half of a reference sampling frequency that is less than or equal to the sampling frequency of the digital audio signal.

7. A method according to claim 6, wherein the z-transform response of the filter has at least three zeroes lying outside the unit circle, each selected such that it has a z-plane reciprocal whose real part is more negative than minus 0.5, wherein z represents a time advance of one sample at the reference sampling frequency.

8. A method according to claim 6, wherein the reference sampling frequency is one of: (i) a sampling of a process that produced the pre-response, (ii) 44.1 kHz, and (iii) 48 kHz.

9. A method according to claim 6, wherein the reference sampling frequency is one of: (i) the sampling frequency of the digital audio signal, and (ii) one half of the sampling frequency of the digital audio signal.

10. A method according to claim 6, wherein the pre-response frequency is not greater than 60% of a signal Nyquist frequency equal to one half of the sampling frequency of the digital audio signal, and wherein the z-transform response of the filter includes a further zero lying outside the unit circle and contributing a group delay greater at the signal Nyquist frequency than at the pre-response frequency.

11. A method according to claim 1, wherein the z-transform response of the filter also includes a pole lying inside the unit circle at a reciprocal position to the zero, the pole and zero together selected to create an all-pass factor in the transfer function of the filter.

12. A method according to claim 1, wherein the z-transform response of the filter comprises one or more zeroes and one or more poles configured such that the combination of zeroes and poles provides an amplitude response flat within 1 dB over the frequency range 0 to 16 kHz.

13. A method according to claim 1, wherein the zero is selected to create a greater group delay at the pre-response frequency than at a comparison frequency lower than the pre-response frequency.

14. A method according to claim 13, wherein the group delay at the pre-response frequency exceeds the group delay at the comparison frequency by at least ten cycles at the pre-response frequency.

15. A method according to claim 13, wherein the comparison frequency is one of: (i) less than or equal to 500 Hz, and (ii) equal to 0 Hz.

16. A method according to claim 1, wherein the group delay introduced at the pre-response frequency exceeds by at least ten cycles at the pre-response frequency the time interval from the start of an impulse response of the filter to a sample thereof having the largest absolute magnitude.

17. The method of claim 1, wherein the modified digital audio signal is provided for further processing prior to delivery to one of (i) a distributor for distribution to a plurality of listeners, and (ii) an audio listening device.

18. The method according to claim 1, wherein generating the modified digital signal is performed using a first device.

19. The method according to claim 18, wherein the first device is one of: (i) a hardware device, (ii) an analog-to-digital converter (ADC) unit, and (iii) a mastering equipment device.

20. The method according to claim 18, wherein the further processing is performed by one of: (i) the first device, and (ii) at least a second device other than the first device.

21. The method according to claim 18, further comprising:
distributing the modified digital audio signal to at least a first listener device.

22. A method for reducing the audible effect of a pre-response having energy at a pre-response frequency, the method comprising:
receiving a digital audio signal;
generating a modified digital audio signal by introducing group delay at the pre-response frequency by filtering the digital audio signal using a digital non-minimum-phase filter having a z-transform response that includes a zero lying outside the unit circle, wherein the zero is selected to create a greater group delay at the pre-response frequency than at a frequency of 0 Hz; and
providing the modified digital audio signal for further processing.

23. A non-transitory computer readable medium having stored therein instructions that when executed on a processor, cause the processor to perform a method for reducing the audible effect of a pre-response having energy at a pre-response frequency, comprising the steps of:
receiving a digital audio signal;
generating a modified digital audio signal by introducing a group delay at the pre-response frequency by filtering the digital audio signal using a digital non-minimum phase filter having a z-transform response that includes a zero lying outside the unit-circle whose phase response is not linearized by a zero at a reciprocal position inside the unit circle; and
providing the modified digital audio signal for further processing.

24. The non-transitory computer readable medium of claim 23,
wherein the device is one of (i) a distributor, and (ii) an audio listening device.

25. The non-transitory computer readable medium of claim 23, wherein the method further comprises the steps of:
performing further processing on the modified digital audio signal; and
providing the further processed modified digital audio signal for subsequent delivery to a device.

26. The non-transitory computer readable medium of claim 23, wherein generating the modified signal is performed using a first device.

27. The non-transitory computer readable medium of claim 26,
wherein the first device is one of: (i) a hardware device, (ii) an analog-to-digital converter (ADC) unit, and (iii) a mastering equipment device.

28. The non-transitory computer readable medium of claim 23,
wherein the further processing is performed by one of: (i) the first device, and (ii) at least a second device other than the first device.

29. The non-transitory computer readable medium of claim 28, further comprising:
distributing the modified digital audio signal to at least a first listener device.

30. The non-transitory computer readable medium of claim 23, wherein the instructions comprise a software plug-in for a Digital Audio Workstation.

\* \* \* \* \*